US010109670B2

(12) United States Patent
Gaeremynck et al.

(10) Patent No.: US 10,109,670 B2
(45) Date of Patent: Oct. 23, 2018

(54) OPTICAL SENSOR HAVING A CURVED DETECTION SURFACE

(71) Applicants: Commissariat a L'Energie Atomique et aux Energies Alternatives, Paris (FR); Centre National de la Recherche Scientifique, Paris (FR)

(72) Inventors: Yann Gaeremynck, Aiguebelle (FR); Emmanuel Hugot, Marseilles (FR); Manuel Fendler, Grenoble (FR)

(73) Assignees: COMMISSARIAT A L'ENERGIE ATOMIQUE EX AUX ENERGIES ALTERNATIVES, Paris (FR); CENTRE NATIONAL DE LA RECHERCHE SCIETIFIQUE, Paris (FR)

( * ) Notice: Subject to any disclaimer, the term of this patent is extended or adjusted under 35 U.S.C. 154(b) by 85 days.

(21) Appl. No.: 15/148,300

(22) Filed: May 6, 2016

(65) Prior Publication Data

US 2016/0358971 A1    Dec. 8, 2016

(30) Foreign Application Priority Data

May 13, 2015    (FR) ...................................... 15 54316

(51) Int. Cl.
*H01L 27/146*    (2006.01)
*G01J 1/42*    (2006.01)
*G01J 3/28*    (2006.01)

(52) U.S. Cl.
CPC ...... *H01L 27/14687* (2013.01); *G01J 1/4228* (2013.01); *H01L 27/14632* (2013.01); *G01J 3/2803* (2013.01)

(58) Field of Classification Search
CPC . H01L 31/02; H01L 27/146; H01L 27/14636; H01L 27/14687; H01L 27/14632; G01J 1/4228; G01J 3/2803
See application file for complete search history.

(56) References Cited

U.S. PATENT DOCUMENTS

| 6,791,072 B1* | 9/2004 | Prabhu | H01L 27/14601 250/208.1 |
| 2005/0163981 A1* | 7/2005 | Osthaus | H01L 23/3677 428/209 |
| 2010/0291726 A1* | 11/2010 | Vieux | H01L 27/14663 438/59 |
| 2016/0315205 A1* | 10/2016 | Ushinsky | H01L 27/1462 |

OTHER PUBLICATIONS

French Preliminary Search Report dated Mar. 17, 2016 in French Application 15 54316, filed May 13, 2015 (with English Translation of Categories of Cited Documents).

* cited by examiner

*Primary Examiner* — Joseph C Nicely
(74) *Attorney, Agent, or Firm* — Oblon, McClelland, Maier & Neustadt, L.L.P.

(57) ABSTRACT

An optical detector with a curved detection surface is provided, including a photosensitive sensor; a support imposing a curvature on the photosensitive sensor; and a glue layer, provided between the photosensitive sensor and the support, with a thickness higher than 50 μm. The glue layer with a high thickness enables requirements imposed on the sensor to be reduced, with an equal radius of curvature, and thus a minimum radius of curvature of the photosensitive sensor to be reduced, thereby compensating for significant defects of an imaging system located upstream.

10 Claims, 3 Drawing Sheets

OPTICAL SENSOR HAVING A CURVED DETECTION SURFACE

TECHNICAL FIELD

The present invention relates to a curved optical detector, used in particular for compensating for some defects of an optical imaging system provided upstream.

STATE OF PRIOR ART

In prior art, different methods for obtaining a curved optical detector, the curvature of which is intended to compensate for optical aberrations of an imaging system located upstream are known. Throughout the text, the term "curvature" refers to a deformation, and not only the reverse of a radius of curvature.

Document U.S. Pat. No. 6,849,843 describes an example of such a method. A silicon chip is glued to a flexible substrate using a glue layer. The glue layer has a very low thickness, typically in the order of 1 to 2 µm. Thus, it is ensured that the shape of the silicon chip closely fits the shape of the flexible substrate. The flexible substrate is glued in turn to a rigid support.

One objective of the present invention is to improve known devices and methods. The aim is in particular to improve the deformation abilities of known curved optical detectors.

DISCLOSURE OF THE INVENTION

This objective is achieved with an optical detector with a curved detection surface comprising:
  a photosensitive sensor;
  a support arranged to impose a curvature on the photosensitive sensor; and
  a glue layer, provided directly between the photosensitive sensor and the support, and having a thickness higher than or equal to 50 µm.

Indeed, it could be observed that a high glue thickness between the photosensitive sensor and the support surprisingly enables requirements imposed on the sensor, with an equal radius of curvature, to be reduced.

Generally accepted ideas of those skilled in the art prompt them on the contrary to restrict as much as possible the thickness of this glue layer. But, it has been noticed that the drawback of these low thicknesses is to restrict the maximum deformation that can be imposed on the sensor without degrading it.

The invention also relates to an optical imaging system comprising an optical detector according to the invention.

The invention also relates to a method for manufacturing an optical detector comprising the following steps of:
  gluing a photosensitive sensor on a support, using a glue layer, provided directly between the photosensitive sensor and the support;
  deforming the support, leading to a deformation in the photosensitive sensor glued on the support;
  the glue layer used having a thickness higher than or equal to 50 µm.

BRIEF DESCRIPTION OF THE DRAWINGS

The present invention will be better understood upon reading the description of exemplary embodiments given by way of indicating and in no way limiting purposes, within reference to the appended drawings in which.

DETAILED DISCLOSURE OF PARTICULAR EMBODIMENTS

Figure 1:
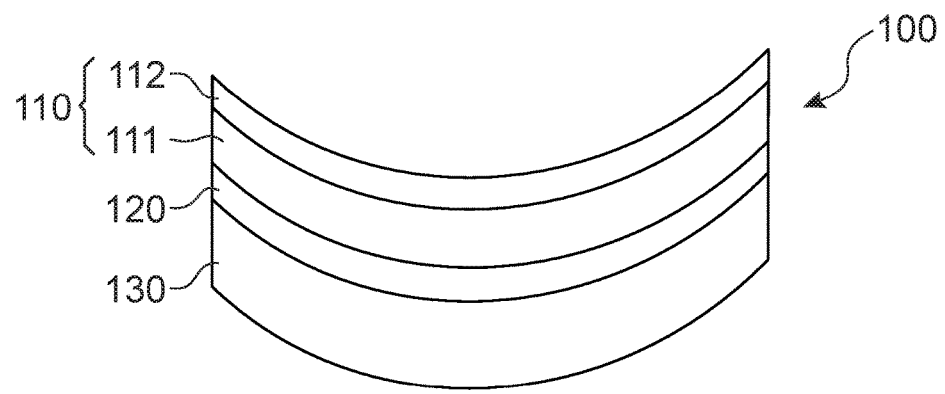
FIG. 1 illustrates an optical detector according to the invention.

FIG. 1 illustrates an exemplary optical detector 100 according to the invention. The optical detector comprises a photosensitive sensor 110, here comprising a so-called active layer 112 integrated on a silicon substrate 111. The active layer 112 comprises for example electrodes. Elements, not represented, such as color filters or microlenses can be provided on the active layer 112. The free surface of the active layer comprises a part dedicated to photon detection, and a part dedicated to a so-called reading electronics, enabling the detected photon to be counted. The surface of the active layer, dedicated to photon detection, is called a detection surface.

The sensor 110 is a known photosensitive sensor, in particular a CCD (Charge-Coupled Device) or CMOS (Complementarity metal-oxide-semiconductor) sensor, and will not be further described in the following.

Throughout the text, the example of a photosensitive sensor of silicon is considered. However, the invention also covers other materials, in particular semi-conductor materials such as cadmium sulfide (CdS) or cadmium selenide (CdSe). Further, the invention is not limited to a sensor for converting an electromagnetic radiation into an electrical signal, but also covers a bolometer type sensor for converting an electromagnetic radiation into heat.

The photosensitive sensor is glued to a support 130, preferably on the side opposite to the active layer 112. This gluing is made thanks to a glue layer 120, provided directly between the photosensitive sensor and the support.

The surface of the support 130 located in contact with the glue layer 120 has a known curvature. Because of the gluing, this curvature is imposed on the photosensitive sensor 110, and in particular on the detection surface. This curvature advantageously has for example the shape of a conoid, or of a sphere portion or of a paraboloid of revolution portion, or a combination of these surfaces, these examples being not limiting. This curvature is preferably defined as a function of one or more optical aberration(s) of an imaging system, that one wishes to compensate for by an adapted shape of the detector. Preferably the detection surface has the shape of a sphere portion and makes it possible to compensate for a field curvature defect of an imaging system upstream of the optical detector when the order 3 of the field curvature is prevalent.

The support 130 is made of a material which supports plasticizing, for example of a plastic material (polymer) or a metal such as steel (for example of the AISI 420 type). The support has for example a thickness of 300 µm. The glue layer 120 has a thickness higher than or equal to 30 µm, preferably higher than or equal to 50 µm. The thickness of the glue layer is preferably between 30 and 150 µm, bounds included, even between 50 and 150 µm, bonds included.

This high thickness of the glue layer makes it possible to reduce requirements imposed on the sensor, with an equal curvature, and thus to increase a maximum deformation of the photosensitive sensor (for example to reduce the minimum radius of curvature). Thus, significant defects of an imaging system located upstream can be compensated for, as detailed in the following.

When it is curved, the photosensitive sensor is subjected to stresses related to the curvature of the sensor per se, and stresses related to the absence of sliding of the sensor 110 on the support 130. It has been shown that a high thickness of the glue layer makes it possible to reduce stresses related to the absence of sliding of the sensor 110 on the support 130.

The table below details results of several numerical simulations, obtained by considering a photosensitive sensor of silicon, with a thickness 50 µm, a width 20 µm and a height 10 mm. The numerical simulation considers the Von Mises stress:

$$\sigma_e = \frac{1}{\sqrt{2}}\sqrt{(\sigma_x - \sigma_y)^2 + (\sigma_y - \sigma_z)^2 + (\sigma_z - \sigma_x)^2}.$$

It is assumed that the Young's modulus of the glue layer is the same in each case, for example 1 MPa. The radius of curvature of the photosensitive sensor is determined, for several thicknesses of the glue layer, when half the yield strength of the sensor is reached. This yield strength is 180 MPa in silicon.

It is reminded that the yield strength is the stress from which a material stops deforming reversibly and begins to be irreversibly deformed. This is more particularly the stress from which the photosensitive sensor has changes in the crystal lattice modifying its optoelectronic properties, or internal microcracks which cause breakage thereof.

TABLE 1

| | Thickness of the glue layer | | | | |
|---|---|---|---|---|---|
| | 2 µm | 10 µm | 50 µm | 80 µm | 120 µm |
| Radius of curvature at half the yield strength | 294 mm | 177 mm | 166 mm | 158 mm | 163 mm |

Thus, it is shown that increasing the thickness of the glue layer makes it possible to minimize the smallest radius of curvature reachable without deteriorating the photosensitive sensor. In other words, the maximum deformation reachable without deteriorating this sensor is increased.

Nothing prompted those skilled in the art to vary the thickness of the glue layer to achieve such a result. On the contrary, it was admitted that this thickness had to be as thin as possible, in particular to limit uncertainties on the positioning of each point of the detection surface of the optical detector. However, the invention is not detrimental to the quality of defect compensation of an imaging system, because it has been noticed that within this context, some positioning inaccuracy of the detection surface can be tolerated.

Further, in accordance with the invention, the Young's modulus of the glue layer is advantageously lower than or equal to 100 MPa. It is preferably between 20 and 80 MPa (limits included), for example 20 MPa. In practice, materials marketed under another trade name can be used, for example a silicone gasket. It is reminded here that the Young's modulus is a constant associated with a material, which relates a tensile stress applied to the material to the deformation of the material. This coefficient characterizes the stiffness of the material. It is assumed that the glue layer is made of an isotropic material. Where appropriate, if this material is not isotropic, a Young's modulus is defined for each space direction, each of these modules meeting the above condition.

Figure 2:
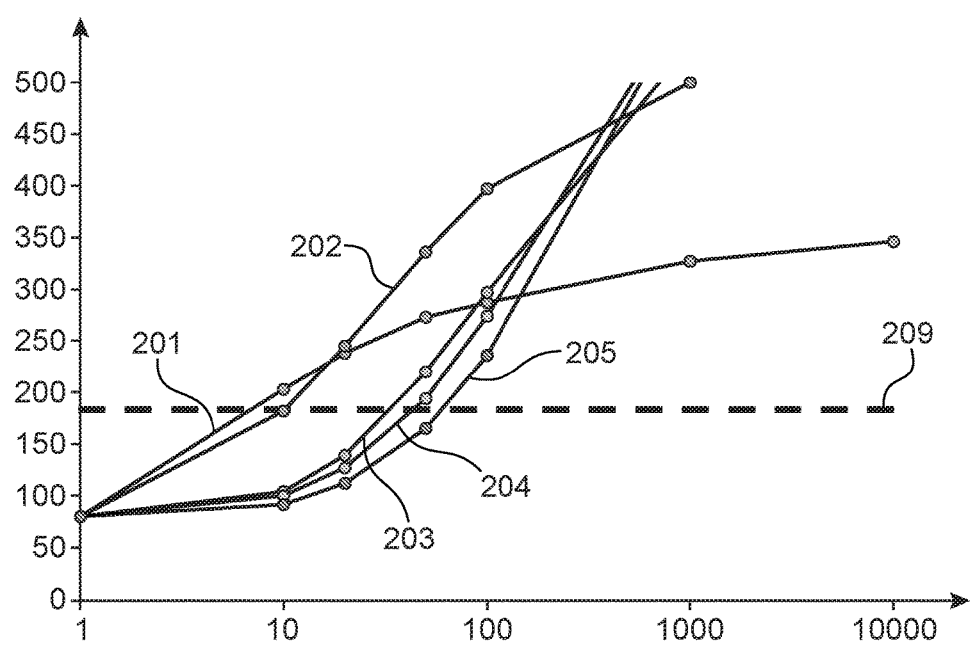
FIG. 2 illustrates stresses in a silicon sensor as a function of the Young's modulus and the thickness of the glue layer.

FIG. 2 illustrates different stress curves in the photosensitive sensor 110, as a function of the Young's modulus of the glue layer 120, for different thicknesses of the glue layer 120, and with an equal deformation. In each case, the photosensitive sensor has a sphere portion shape, with a radius of curvature equal to 166 mm.

The curves 201, 202, 203, 204, 205 correspond to a thickness of 2 µm, 10 µm, 50 µm, 80 µm and 120 µm respectively. There are obtained by numerical simulation, as described with respect to table 1.

The straight line 209, in dotted lines, represents the yield strength of the material forming the photosensitive sensor 110, herein silicon.

It can be seen that for a thickness of the glue layer equal to 2 µm, only glues having a very low Young's modulus enable the desired deformation to be reached while remaining under the yield strength. In particular, for a thickness of the glue layer of 2 µm, the Young's modulus of the glue has to be lower than 9 MPa.

As this thickness increases, an increasingly wide Young's modulus range makes it possible to reach the desired deformation while remaining under the yield strength of the photosensitive sensor.

Thus, a high thickness of the glue layer 120 makes it possible to dispense with any drastic condition on the Young's modulus to reach a significant deformation of the photosensitive sensor 110 while avoiding to deteriorate it.

Before, those skilled in the art were prompted to use glues with a high Young's modulus, for example higher than 150 MPa, in order to ensure an excellent position keeping of the sensor on the support. The measures above show that on the contrary, it is more advantageous to choose glues having a not very high Young's modulus. Even if a Young's modulus lower than 80 MPa would cause a slight positioning inaccuracy of the sensor 110 relative to the support 130, this inaccuracy can be tolerated within the scope of defect compensation of an imaging system, as long as this is within the field depth of the optical system considered. However, the inaccuracy remains moderated since the Young's modulus remains higher than or equal to 20 MPa. Typically, for a Young's modulus between 20 and 80 MPa, and a thickness of the glue layer between 30 and 150 µm, this inaccuracy is in the order of few micrometers, which value is generally lower than the field depth.

Figure 3:
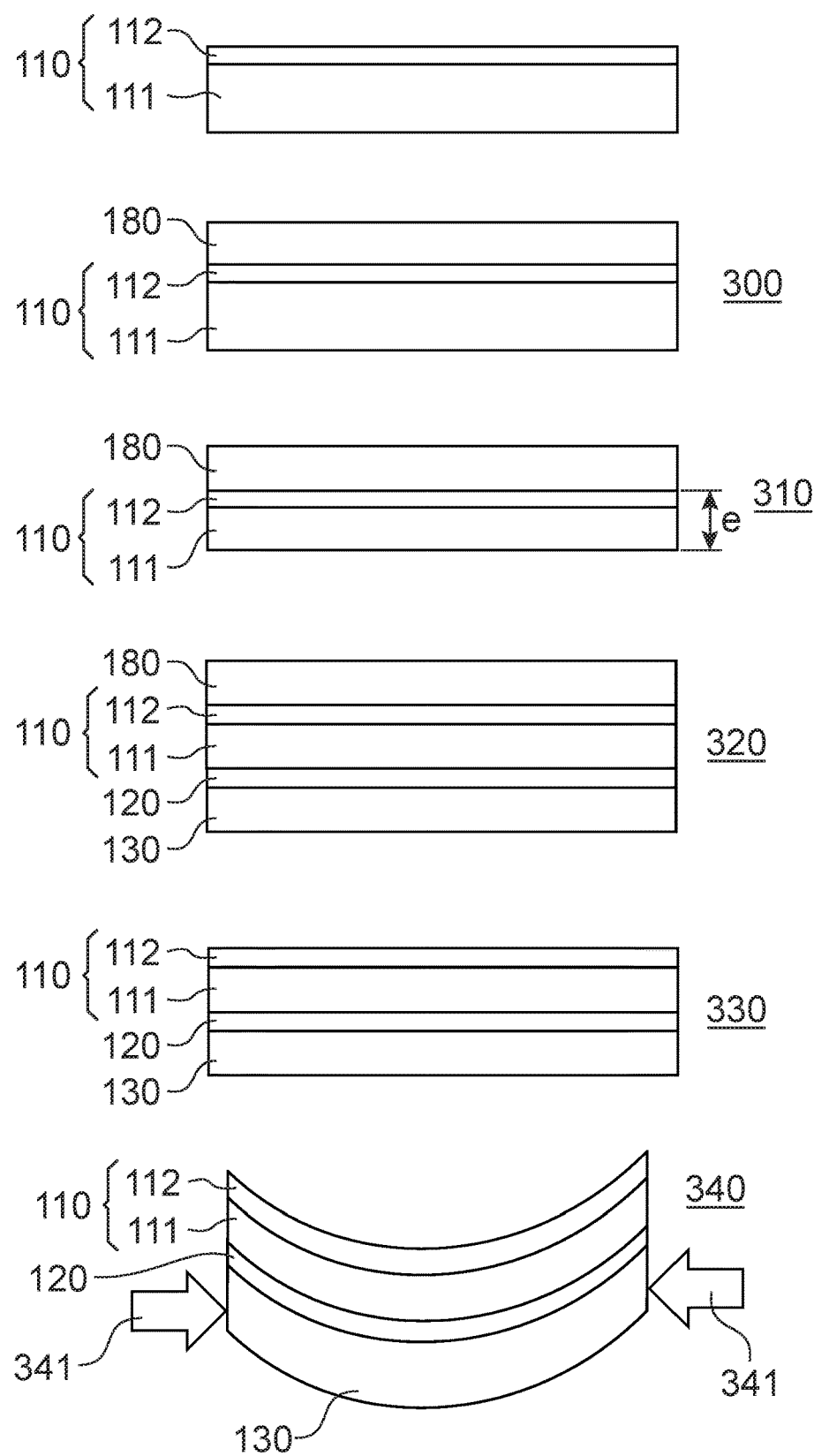
FIG. 3 schematically illustrates a method for manufacturing an optical detector according to the invention.

FIG. 3 illustrates an examplary of method for manufacturing an optical detector as represented in FIG. 1.

The starting point of this manufacturing method is a so-called "processed" silicon layer, that is having an active layer 112 at the surface of a silicon substrate 111. The active layer and the silicon substrate form together a photosensitive sensor 110 as described in reference to FIG. 1.

During a step 300, a substrate layer 180 such as silicon or glass is attached to the active layer 112. The layer 180 forms a handle, making it possible to readily handle the photosensitive sensor 110.

In the step 310, the silicon substrate is thinned such that the photosensitive sensor 110 has after thinning a thickness lower than or equal to 150 µm. This thickness is generally between 25 and 150 µm.

In step 320, the assembly formed by the layer 180 and the photosensitive sensor 110 is glued on a support 130, via a glue layer 120. The support and the glue layer are accurately described in reference to FIG. 1. The glue layer 120 is provided directly between an upper face of the support 130 and a lower face of the photosensitive sensor 110, on the side opposite to the active layer 112. The glue layer 120 extends throughout the surface of the photosensitive sensor. In step 330, the handle forming layer 180 is removed. Where appropriate, filters, in particular color filters and/or microlenses, etc. are added on the photosensitive sensor.

Then, during a step 340, the support 130 is deformed. This deformation is controlled, that is the characteristics of this deformation, in particular the final shape of the upper face of the support 130, in contact with the glue layer 120, are controlled. The controlled deformation of the support 130 causes the same controlled deformation of the photosensitive sensor 110, kept integral with the support throughout its extent by virtue of the glue layer 120.

The deformation of the support is made by applying side stresses to the support, that is forces oriented in a plane parallel to the plane of the photosensitive sensor before any deformation. These side stresses are symbolized by arrows 341. For example, the support is laterally surrounded by actuators.

Alternatively, the deformation of the support is made using underpressure or overpressure cavities provided on the side of the support opposite to the glue layer.

According to another alternative, the deformation of the support is made by keeping the outer edges of the support fixed, and by exerting tensile or compressive forces on handles attached on the side of the support opposite to the glue layer.

An advantageous use of the optical detector according to the invention will now be described in reference to FIGS. 4A and 4B.

Figure 4A:
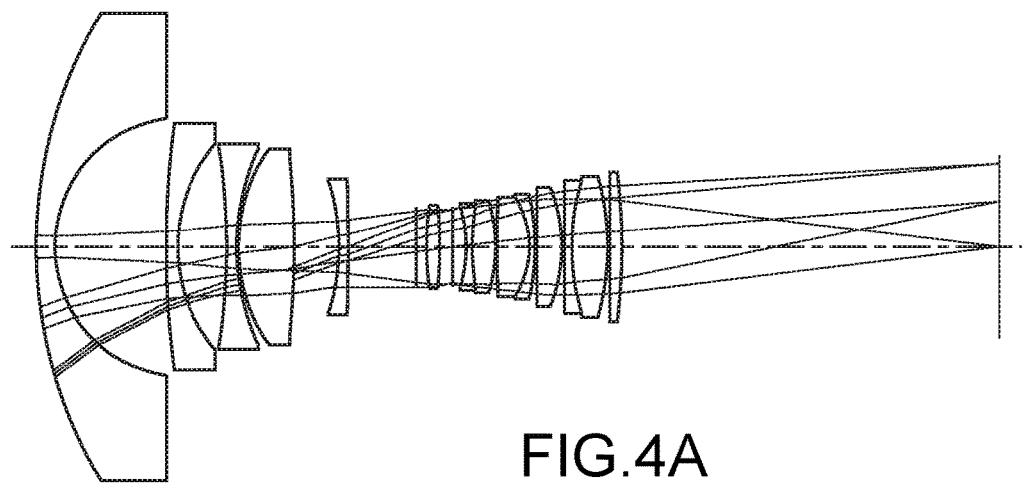
FIGS. 4A and 4B represent two alternatives of an imaging system and illustrate an advantageous use of an optical detector according to the invention.

FIG. 4A illustrates an optical system as described in patent application EP 2 407 809. This is a variable magnification wide-angle camera lens. The input incidence angle of this optical system ranges from −89° to +89°. The lens is analyzed in particular for five zoom values corresponding to a focal length of 8.5 mm, 10 mm, 12 mm, 13.5 mm and 14.8 mm respectively, and for the three wavelengths 588 nm, 656 nm and 486 nm. It is shown that it has an excellent optical performance, in particular in terms of field curvature. This performance has however a cost: this optical system is comprised of 14 lenses, implementing 10 different glass types and 2 aspherical surfaces.

Figure 4B:
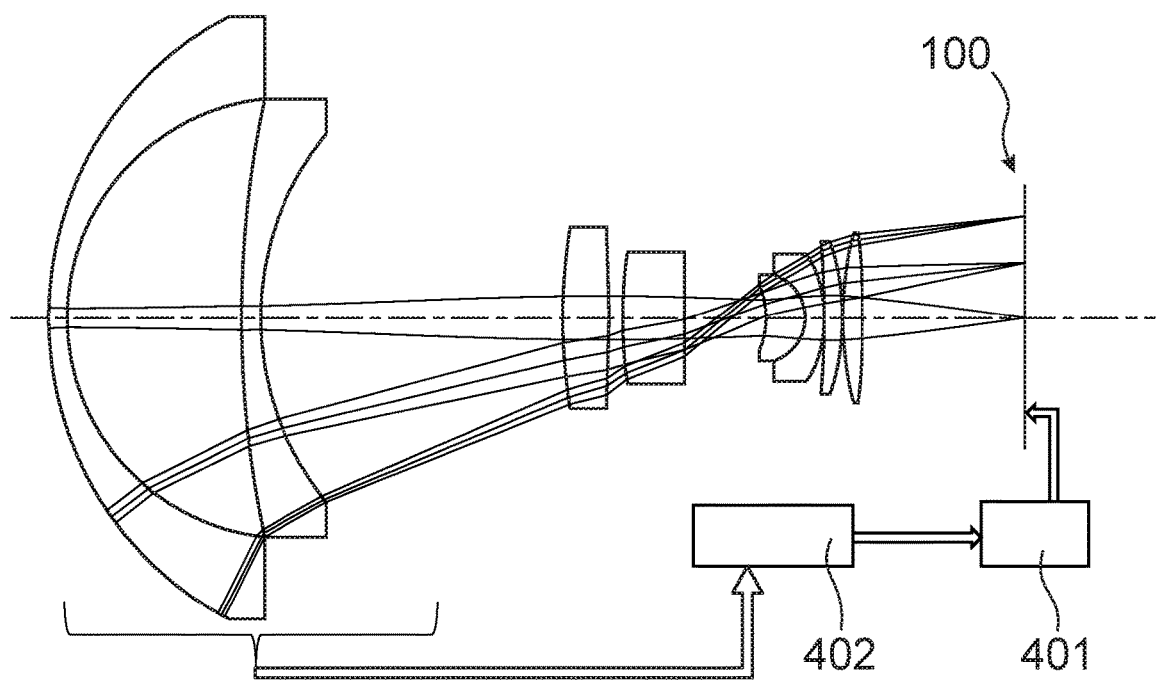

FIG. 4B illustrates an alternative of the optical system of FIG. 4A. The optical system of FIG. 4B only comprises 8 lenses, implementing 4 different glass types and only spherical surfaces. The optical system of FIG. 4B thus implies much lesser manufacturing costs. The table herein below accurately describes the optical system. The interfaces of the optical system are numbered from 1 to 15, from left to right in FIG. 4B. The material corresponds to what is on the right of the interface, in practice a glass at the input of a lens, air at the output of a lens (except for the interface 10 which corresponds both to the output interface of the 5$^{th}$ lens and to the input interface of the 6$^{th}$ lens). The distance measurements are positive when moving in the light ray direction (from left to right in FIG. 4B), otherwise negative.

TABLE 2

| Interface | Radius of curvature (mm$^{-1}$) | Thickness (mm) | Material |
|---|---|---|---|
| 1 | 2.692E−02 | 2.00 | J-LASF015 |
| 2 | 4.189E−02 | 18.80 | Air |
| 3 | 8.868E−03 | 2.00 | J-LASF015 |
| 4 | 3.198E−02 | Variable | Air |
| 5 | 1.659E−02 | 5.00 | SF58 |
| 6 | −7.337E−03 | 1.57 | Air |
| 7 | 1.636E−02 | 6.60 | J-LASF015 |
| 8 | 7.121E−03 | 8.79 | Air |
| 9 | −1.018E−01 | 4.26 | LASFN31 |
| 10 | −2.042E−01 | 2.00 | SF58 |
| 11 | −7.167E−02 | 0.00 | Air |
| 12 | −9.710E−03 | 2.00 | SF58 |
| 13 | −4.124E−02 | 0.00 | Air |
| 14 | 2.945E−02 | 2.21 | P-PK53 |
| 15 | −1.260E−02 | Variable | Air |

This is also a variable magnification wide-angle camera lens. The magnification variation is made by modifying the distance between the second and third lenses (thickness of the interface 4). The image formed by the lens is received by an optical detector. The position of this optical detector has to be adjusted as a function of the lens magnification (thickness of the interface 15).

The input incidence angle of this optical system ranges from −89° to +89°. The lens is in particular analyzed for the same five focal lengths and the same three wavelengths. It is shown that it has an excellent optical performance, quite comparable to that of the optical system of FIG. 4A, in particular as regards distortion, spherical aberration, astigmatism, axial chromatism and longitudinal chromatism. On the other hand, the field curvature is much higher, about 2.5 times higher. But, this aberration can be corrected not by modifying the optical system, but quite simply by compensating for the field curvature by an identical curvature of the optical detector receiving the image formed by the optical system. The optical detector according to the invention makes it possible, by virtue of the characteristics of the glue layer, to easily reach significant deformations. It is thus possible to correct easily and at a low cost, significant defects of an optical imaging system. Thus, the invention makes it possible to resort to imaging systems having a strong field curvature, and to easily compensate for this defect by the shape of the optical detector. Other optical aberrations such as astigmatism can be compensated for in the same way. However, it is not necessary to compensate for more than the remaining aberrations such as chromatism, which provides some positioning tolerance on each point of the detection surface of the optical detector.

In this particular example, the detection surface of the optical detector is deformed in a sphere portion shape. The radius of curvature of this sphere portion depends on the lens focal length, and assumes the following values (the focal length variation causes a magnification variation):

TABLE 3

| Focal length | 8.5 mm | 10 mm | 12 mm | 13.5 mm | 14.8 mm |
|---|---|---|---|---|---|
| Radius of curvature | 638 mm | 255 mm | 180 mm | 166 mm | 200 mm |

Based on table 1, a thickness of the glue layer of 50 μm or more enables a minimum radius of curvature of 166 mm to be reached. Thus, the optical detector according to the invention can assume all these values of radiuses of curvature.

In FIG. 4B, is schematically represented the optical detector 100 according to the invention, connected to support deforming means 401, themselves controlled by control engineering means 402, or control means 402. The control engineering means 402 are arranged to drive in real time the support deforming means 401, as a function of the lens focal length. In FIG. 4B, it can be seen that the control engineering means 402 receive as an input a setpoint related to the lens focal length, in particular the distance between the second and third lenses. The control engineering means relate the setpoint related to the lens focal length, and a setpoint related to the curvature of the optical detector. The setpoint related to the curvature of the optical detector is provided to the support deforming means 401. The support deforming means can be similar to what has been described about step 340, in reference to FIG. 3.

Thus, the deformation of the support, and with it the deformation of the photosensitive sensor, is driven in real time, according to the adaptive optics principle. The deformation is reversible, and varies as a function of a deformation setpoint. The deformation setpoint here varies as a function of the focal length of the variable focal length imaging system located upstream of the optical detector.

The support deformation in real time is not necessary to the definition of the invention. Indeed, the optical detector according to the invention can also compensate for defects of a fixed focal length optical imaging system. Further, in the case of a variable focal length optical system, the focal length variation has not systematically an impact on the field curvature defect.

A particular exemplary embodiment will now be described, illustrating in particular the strong deformation potential of the optical detector according to the invention.

According to this example, the optical detector has a fixed curvature. The face of the active layer 112, on the side opposite to the substrate 11, is a 20×10 mm$^2$ rectangle. The greater side of this rectangle defines the width of the photosensitive sensor. Half this upper surface is dedicated to photon detection, that is a 10×10 mm$^2$ square. This square forms the detection surface. The upper surface of the photosensitive sensor has a sphere shape, with a radius of curvature equal to 80 mm. Alternatives of this embodiment can be made, by using the dimensions indicated above and by applying them a simple homothety. Thereby, the ratio of the width of the photosensitive sensor (20 mm) to the radius of curvature of the photosensitive sensor (80 mm) is retained. This ratio is equal to ¼. According to the invention, this ratio can be higher than or equal to ⅛, preferably higher than or equal to 3/16, or even ¼. It is noticed that since the deformation is spherical, it is important to consider the sensor dimensions. With an equal radius of curvature, the larger the sensor, the higher the stresses exerted at the corners thereof.

The upper surface of the photosensitive sensor thus have a deformation the peak-valley amplitude of which is about 624 μm. The peak-valley amplitude of the deformation of the upper surface of the photosensitive sensor is the distance, along an axis (Oz), between the highest point of said upper surface along (Oz), and the lowest point of said upper surface along (Oz). The orientation of the axis (Oz) is chosen such that this distance is minimum.

According to the invention, this peak-value amplitude is for example higher than or equal to 300 μm, and can be between 300 μm and 1 mm. The ratio of the width of the photosensitive sensor (20 mm) and this amplitude (624 μm) is thus equal to about 32. According to the invention, this ratio can be lower than or equal to 64, preferably lower than or equal to 48, or even 32. Sometimes, it is preferred to use a ratio implying a peak-valley amplitude, in particular when the photosensitive sensor has not the shape of a simple sphere portion (without necessarily having a cylinder of revolution portion shape).

The invention is not restricted to the examples just described, and those skilled in the art will be able to make numerous alternatives without departing from the scope of the present invention. For example, the upper surface of the photosensitive sensor can have an aspherical shape.

The invention claimed is:

1. An optical detector with a curved detection surface comprising:
    a photosensitive sensor;
    a support arranged to impose a curvature on the photosensitive sensor;
    a glue layer, provided directly between the photosensitive sensor and the support, and arranged to glue the photosensitive sensor to the support in such a way that the support imposes said curvature on the photosensitive detector; and
    a support deforming means arranged to reversibly deform the support,
    wherein the glue layer has a thickness greater than or equal to 50 μm and has a Young's modulus between 20 MPa and 80 MPa, bounds included.

2. The optical detector according to claim 1, wherein the glue layer has a thickness between 50 μm and 150 μm, bounds included.

3. The optical detector according to claim 1, wherein the photosensitive sensor comprises a substrate of a semiconducting material, in direct contact with the glue layer.

4. The optical detector according to claim 3, wherein the substrate is of silicon.

5. The optical detector according to claim 1, wherein a ratio of a width of the photosensitive sensor to a radius of curvature of the photosensitive sensor is greater than or equal to ⅛.

6. The optical detector according to claim 1, wherein a ratio of a width of the photosensitive sensor to a peak-valley amplitude of the upper surface of the photosensitive sensor is less than or equal to 40.

7. The optical detector according to claim 1, wherein the support deforming means is connected to control engineering means which is arranged to drive in real time the support deforming means.

8. The optical detector according to claim 7, wherein the control engineering means are arranged to:
    receive as an input a setpoint related to the focal length of a lens,
    relate said setpoint related to the focal length of a lens with a setpoint related to the curvature of the optical detector, and
    provide said setpoint related to the curvature of the optical detector to the support deforming means.

9. An optical imaging system comprising an optical detector according to claim 1.

10. A method for manufacturing an optical detector comprising:
    gluing a photosensitive sensor on a support, using a glue layer provided directly between the photosensitive sensor and the support and arranged to glue the photosensitive sensor to the support in such a way that the support can impose a curvature on the photosensitive detector;
    disposing the support in support deforming means arranged to reversibly deform the support; and reversibly deforming the support, leading to a reversible deformation of the photosensitive sensor glued on the support, whereby the support imposes a curvature on the photosensitive detector,
wherein the glue layer used has a thickness greater than or equal to 50 µm and has a Young's modulus between 20 MPa and 80 MPa, bounds included.

\* \* \* \* \*